(12) United States Patent
Sundar et al.

(10) Patent No.: US 12,082,509 B2
(45) Date of Patent: Sep. 3, 2024

(54) DUAL MAGNETIC TUNNEL JUNCTION (DMTJ) STACK DESIGN

(71) Applicant: Taiwan Semiconductor Manufacturing Company, Ltd., Hsinchu (TW)

(72) Inventors: Vignesh Sundar, Fremont, CA (US); Yu-Jen Wang, San Jose, CA (US); Luc Thomas, San Jose, CA (US); Guenole Jan, San Jose, CA (US); Sahil Patel, Fremont, CA (US); Ru-Ying Tong, Los Gatos, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1004 days.

(21) Appl. No.: 17/063,392

(22) Filed: Oct. 5, 2020

(65) Prior Publication Data
US 2021/0020830 A1    Jan. 21, 2021

Related U.S. Application Data

(62) Division of application No. 16/133,964, filed on Sep. 18, 2018, now Pat. No. 10,797,225.

(51) Int. Cl.
*H10N 50/80*    (2023.01)
*G11C 11/16*    (2006.01)
(Continued)

(52) U.S. Cl.
CPC ........... *H10N 50/80* (2023.02); *G11C 11/161* (2013.01); *H01F 10/3259* (2013.01);
(Continued)

(58) Field of Classification Search
CPC .............. G11C 11/161; H01F 10/3259; H01F 10/3286; H01F 10/329; H01F 41/302;
(Continued)

(56) References Cited

U.S. PATENT DOCUMENTS 4,818,721 A * 4/1989 Wang ................. H01L 21/2656
                                                            257/280
6,166,948 A   12/2000 Parkin et al.
(Continued)

FOREIGN PATENT DOCUMENTS

JP    2008098523    4/2008
JP    WO2009101827   6/2011
(Continued)

OTHER PUBLICATIONS

German Patent Application No. 102019124033, German Patent and Trademark Office, Examination search report, dated Apr. 26, 2022, 10 pages.
(Continued)

*Primary Examiner* — Michelle Mandala
*Assistant Examiner* — Kevin Quinto
(74) *Attorney, Agent, or Firm* — HAYNES AND BOONE, LLP

(57) ABSTRACT

A dual magnetic tunnel junction (DMTJ) is disclosed with a PL1/TB1/free layer/TB2/PL2/capping layer configuration wherein a first tunnel barrier (TB1) has a substantially lower resistance x area ($RA_1$) product than $RA_2$ for an overlying second tunnel barrier (TB2) to provide an acceptable net magnetoresistive ratio (DRR). Moreover, magnetizations in first and second pinned layers, PL1 and PL2, respectively, are aligned antiparallel to enable a lower critical switching current than when in a parallel alignment. An oxide capping layer having a $RA_{CAP}$ is formed on PL2 to provide higher PL2 stability. The condition $RA_1<RA_2$ and $RA_{CAP}<RA_2$ is
(Continued)

achieved when TB1 and the oxide capping layer have one or both of a smaller thickness and a lower oxidation state than TB2, are comprised of conductive (metal) channels in a metal oxide or metal oxynitride matrix, or are comprised of a doped metal oxide or doped metal oxynitride layer.

20 Claims, 7 Drawing Sheets

(51) Int. Cl.
*H01F 10/32* (2006.01)
*H01F 41/34* (2006.01)
*H10N 50/01* (2023.01)
*H10N 50/85* (2023.01)

(52) U.S. Cl.
CPC ....... *H01F 10/3286* (2013.01); *H01F 10/329* (2013.01); *H01F 41/34* (2013.01); *H10N 50/01* (2023.02); *H10N 50/85* (2023.02)

(58) Field of Classification Search
CPC ........ H01F 41/34; H10N 50/01; H10N 50/10; H10N 50/80; H10N 50/85
See application file for complete search history.

(56) References Cited

U.S. PATENT DOCUMENTS

| | | | |
|---|---|---|---|
| 6,593,608 B1 | 7/2003 | Sharma et al. | |
| 6,743,503 B1 | 6/2004 | Chen | |
| 6,834,005 B1 | 12/2004 | Parkin | |
| 6,847,510 B2 | 1/2005 | Childress et al. | |
| 6,974,708 B2 | 12/2005 | Horng et al. | |
| 6,977,801 B2 | 12/2005 | Carey et al. | |
| 7,027,268 B1 | 1/2006 | Zhu et al. | |
| 7,180,713 B2 | 2/2007 | Nagasaka et al. | |
| 7,241,631 B2 | 7/2007 | Huai et al. | |
| 7,335,961 B2 | 2/2008 | Guo et al. | |
| 7,449,345 B2 | 11/2008 | Horng et al. | |
| 7,480,173 B2 | 1/2009 | Guo et al. | |
| 7,596,015 B2 | 9/2009 | Kitagawa et al. | |
| 7,742,263 B2 | 6/2010 | Fukumoto et al. | |
| 7,948,044 B2 | 5/2011 | Horng et al. | |
| 7,978,442 B2 | 7/2011 | Zhang et al. | |
| 8,057,925 B2 | 11/2011 | Horng et al. | |
| 8,159,866 B2 | 4/2012 | Apalkov et al. | |
| 8,203,389 B1 | 6/2012 | Zhou et al. | |
| 8,233,249 B2 | 7/2012 | Worledge et al. | |
| 8,269,292 B2 | 9/2012 | Horng et al. | |
| 8,270,112 B2 | 9/2012 | Funayama et al. | |
| 8,456,882 B2 | 6/2013 | Apalkov et al. | |
| 8,462,461 B2 | 6/2013 | Braganca et al. | |
| 8,582,240 B1 | 11/2013 | Chen et al. | |
| 8,604,886 B2 | 12/2013 | Nikonov et al. | |
| 8,634,163 B2 | 1/2014 | Tanabe et al. | |
| 8,785,966 B2 | 7/2014 | Worledge et al. | |
| 8,921,961 B2 | 12/2014 | Kula et al. | |
| 8,981,505 B2 | 3/2015 | Moriyama et al. | |
| 9,006,704 B2 | 4/2015 | Jan et al. | |
| 9,024,415 B2 | 5/2015 | Zhang et al. | |
| 9,230,571 B1 | 1/2016 | Chen et al. | |
| 9,373,781 B2 | 6/2016 | Tang et al. | |
| 9,553,258 B2 | 1/2017 | Whig et al. | |
| 9,614,258 B2 | 4/2017 | Takahashi et al. | |
| 10,381,550 B1* | 8/2019 | Duan ..................... | H10N 50/10 |
| 2004/0202924 A1 | 10/2004 | Tao et al. | |
| 2007/0085068 A1 | 4/2007 | Apalkov et al. | |
| 2007/0171694 A1 | 7/2007 | Huai et al. | |
| 2008/0088980 A1 | 4/2008 | Kitagawa et al. | |
| 2008/0180991 A1 | 7/2008 | Wang | |
| 2010/0034014 A1* | 2/2010 | Ohno ..................... | H10N 50/10 |
| | | | 365/158 |
| 2010/0072524 A1 | 3/2010 | Huai et al. | |
| 2010/0315863 A1 | 12/2010 | Zhu et al. | |
| 2012/0012953 A1 | 1/2012 | Lottis et al. | |
| 2012/0023386 A1 | 1/2012 | Oh et al. | |
| 2012/0058575 A1 | 3/2012 | Horng et al. | |
| 2012/0155156 A1 | 6/2012 | Watts et al. | |
| 2012/0156891 A1 | 6/2012 | Lin et al. | |
| 2012/0205758 A1 | 8/2012 | Jan et al. | |
| 2012/0292723 A1 | 11/2012 | Luo et al. | |
| 2012/0299135 A1 | 11/2012 | Zheng et al. | |
| 2013/0175644 A1 | 7/2013 | Horng et al. | |
| 2013/0230741 A1 | 9/2013 | Wang et al. | |
| 2014/0061828 A1 | 3/2014 | Lim et al. | |
| 2014/0217528 A1 | 8/2014 | Whig et al. | |
| 2014/0306302 A1 | 10/2014 | Jan et al. | |
| 2015/0008547 A1* | 1/2015 | Pi ........................... | H10B 61/00 |
| | | | 257/421 |
| 2016/0072043 A1* | 3/2016 | Park ....................... | H10N 50/01 |
| | | | 257/421 |
| 2016/0315249 A1 | 10/2016 | Kardasz et al. | |
| 2017/0084836 A1 | 3/2017 | Kim et al. | |
| 2017/0098762 A1 | 4/2017 | Worledge | |
| 2017/0294482 A1 | 10/2017 | Hu et al. | |
| 2018/0005746 A1 | 1/2018 | Thomas et al. | |
| 2019/0189910 A1 | 6/2019 | Patel et al. | |
| 2019/0207091 A1* | 7/2019 | Kardasz ................. | H10N 50/01 |
| 2020/0136025 A1 | 4/2020 | Patel et al. | |

FOREIGN PATENT DOCUMENTS

| | | |
|---|---|---|
| KR | 20070004094 | 1/2007 |
| KR | 20140028757 | 3/2014 |
| KR | 20180002545 | 1/2018 |
| TW | 201447879 A | 12/2014 |
| TW | 201810745 A | 3/2018 |
| WO | WO 2005112034 | 11/2005 |
| WO | WO2009101827 | 8/2009 |

OTHER PUBLICATIONS

Zhu, Jian-Gang, et al., "Microwave Assisted Magnetic Recording", IEEE Transactions on Magnetics, vol. 44, No. 1, Jan. 2008, pp. 125-131.

Kubota, Hitoshi, et al., "Spin-Torque Oscillator Based on Magnetic Tunnel Junction with a Perpendicular Magnetized Free Layer and In-Plane Magnetized Polarizer", 2013 The Japan Society of Applied Physics, Applied Physics Express 6 (2013) 103003, Sep. 27, 2013, pp. 1-3.

Zeng, Zhongming, et al., "High-Power Coherent Microwave Emission from Magnetic Tunnel Junction Nano-oscillators with Perpendicular Anisotropy", 2012 American Chemical Society, Jun. 4, 2012, vol. 6, No. 7, pp. 6115-6121.

Klaua, M., et al., "Growth, structure, electronic, and magnetic properties of MgO/Fe(001) bilayers and Fe/MgO/Fe(001) trilayers", Physical Review B, vol. 64, 134411, 2001 The American Physical Society, pp. 1-8.

Ikeda, S, et al., "A perpendicular-anisotropy CoFeB—MgO magnetic tunnel junction", nature materials, Letters published online: Jul. 11, 2010, DOI: 10.1038/NMAT2804, www.nature.com/naturematerials, pp. 1-4.

PCT Search Report, International Application No. PCT/US12/24613, Applicant: MagIC Technologies, Inc., dated Jun. 20, 2012, 12pgs.

Slonczweski, J.C., "Current-driven excitation of magnetic multilayers", Journal of Magnetism and Magnetic Materials, vol. 159, Issues 1-2, Jun. 1996, pp. L1-L7, Elsevier.

PCT Search Report, International Application No. PCT/US2014/010309, Applicant: Headway Technologies, Inc., dated May 13, 2014, 10pgs.

Hosomi, M., et al., "A Novel Nonvolatile Memory with Spin Torque Transfer Magnetization Switching: Spin-RAM", IEEE International Electron Devices Meeting, 2005, Dec. 5, 2005, IEDM Technical Digest, 4 pages.

Meng, Hao, et al., "Composite free layer for high density magnetic random access memory with lower spin transfer current", Applied Physics Letters 89, 152509 (2006), Oct. 12, 2006, pp. 152509-1 to 152509-3.

(56) References Cited

OTHER PUBLICATIONS

Hayakawa, Jun, et al., "Current-induced magnetization switching in MgO barrier based magnetic tunnel junctions with CoFeB/Ru/CoFeB synthetic ferrimagnetic free layer", 2006, pp. 1-20, found: https://arxiv.org/ftp/cond-mat/papers/0609/0609306.pdf.

Tserkovnyak, et al., "Enhanced Gilbert Damping in Thin Ferromagnetic Films", Physical Review Letters, vol. 88, No. 11, Mar. 18, 2002, pp. 117601-1 to 117601-4.

Diao, Zhitao, et al., "Spin transfer switching in dual MgO magnetic tunnel junctions", Applied Physics Letters 90, 132508 (2007), Mar. 28, 2007, pp. 1-3.

Hayakawa, Jun, et al., "Current-Driven Magnetization Switching in CoFeB/MgO/CoFeB Magnetic Tunnel Junctions", Japanese Journal of Applied Physics, vol. 44, No. 41, 2005, Sep. 30, 2005, pp. L 1267-L 1270.

Kawahara, T., et al., "2Mb Spin-Transfer Torque RAM (SPRAM) with Bit-by-Bit Bidirectional Current Write and Parallelizing-Direction Current Read", ISSCC 2007/Session 26/Non-Volatile Memories/ 26.5 2007, IEEE International Solid-State Circuits Conference, Feb. 11-15, 2007, pp. 480-481 and 617.

Huai, Yiming, et al., "Spin transfer switching current reduction in magnetic tunnel junction based dual spin filter structures", Applied Physics Letters 87, 222510 (2005), Nov. 2005, pp. 1-3.

Oogane, Mikihiko, et al., "Magnetic Damping in Ferromagnetic Thin Films", Japanese Journal of Applied Physics, vol. 45, No. 5A, 2006, May 9, 2006, pp. 3889-3891.

Berger, L., "Multilayer configuration for experiments of spin precession induced by a dc current", Journal of Applied Physics, vol. 93, No. 10, May 15, 2003, pp. 7693-7695.

Worledge, D.C., "Theory of Spin Torque Switching Current for the Double Magnetic Tunnel Junction", IEEE Magnetics Letters, vol. 8, May 23, 2017, DOI: 10.1109/LMAG.2017.2707331, pp. 1-6.

Hu, G., et al., "STT-MRAM with double magnetic tunnel junctions", 2015, IEEE International Electron Devices Meetings (IEDM), Dec. 7-9, 2015, pp. 1-4.

* cited by examiner

| Element | Oxide | Free energy of formation per mol of $O_2$ ($\times 10^{-6}$ J.kmol-1) |
|---|---|---|
| Au | $Au_2O_3$ | 109 |
| Ag | $Ag_2O_3$ | -7 |
| Ru | $RuO_2$ | -253 |
| Cu | $CuO$ | -254 |
| Co | $CoO$ | -426 |
| Ni | $NiO$ | -432 |
| Fe | $FeO$ | -488 |
| Fe | $Fe_2O_3$ | -495 |
| Mo | $MoO_2$ | -502 |
| W | $WO_3$ | -509 |
| Sn | $SnO$ | -514 |
| Zn | $ZnO$ | -636 |
| Cr | $Cr_2O_3$ | -699 |
| Nb | $Nb_2O_5$ | -708 |
| Ta | $Ta_2O_5$ | -788 |
| B | $B_2O_3$ | -796 |
| Si | $SiO_2$ | -805 |
| Mn | $Mn_2O_3$ | -854 |
| Ti | $TiO_2$ | -890 |
| Zr | $ZrO_2$ | -1037 |
| Al | $Al_2O_3$ | -1053 |
| Ba | $BaO$ | -1056 |
| Hf | $HfO_2$ | -1084 |
| Mg | $MgO$ | -1146 |
| Ca | $CaO$ | -1208 |

DUAL MAGNETIC TUNNEL JUNCTION (DMTJ) STACK DESIGN

PRIORITY DATA

The present application is a divisional application of U.S. patent application Ser. No. 16/133,964, filed Sep. 18, 2018, which is incorporated herein by reference in its entirety.

RELATED PATENT APPLICATIONS

This application is related to the following: U.S. Pat. No. 8,057,925; Ser. No. 15/841,479, filing date Dec. 14, 2017; Ser. No. 15/728,818, filing date Oct. 10, 2017; Ser. No. 16/056,701, filing date Aug. 7, 2018, which are assigned to a common assignee and herein incorporated by reference in their entirety.

TECHNICAL FIELD

The present disclosure relates to a dual magnetic tunnel junction (DMTJ) comprised of a free layer that interfaces with a lower tunnel barrier (TB1) layer and an upper tunnel barrier (TB2) layer, wherein the TB1 layer has a resistance x area ($RA_1$) product substantially less than $RA_2$ for the TB2 layer, and pinned layers PL1 and PL2 adjoining TB1 and TB2, respectively, are initialized antiparallel to each other, and where a metal oxide layer or a magnetic layer with (111) texture is formed on a PL2 top surface to improve PL2 magnetization stability.

BACKGROUND

Perpendicularly magnetized MTJs (p-MTJs) are a major emerging technology for use as embedded magnetic random access memory (MRAM) applications, and standalone MRAM applications. P-MTJ MRAM technology using spin-torque (STT-MRAM) for writing of memory bits was described by C. Slonczewski in "Current driven excitation of magnetic multilayers", J. Magn. Magn. Mater. V 159, L1-L7 (1996), and is highly competitive with existing semiconductor memory technologies such as SRAM, DRAM, and flash.

Reducing the critical switching current density for p-MTJs is a key challenge for integrating MRAM and STT-MRAM into existing complementary metal oxide semiconductor (CMOS) technologies. As the write current is reduced, smaller transistors may be used for each bit cell thereby potentially enabling higher density memory arrays and lower production cost. One of the strategies explored in the past for minimizing the critical current ($i_C$) for switching the free layer in a p-MTJ is a dual spin filter structure also referred to as a DMTJ. A typical DMTJ has a PL1/TB1/FL/TB2/PL2 configuration wherein PL1 and PL2 are first and second pinned layers, that adjoin first and second tunnel barrier layers TB1 and TB2, respectively, and create a spin torque effect on the free layer (FL) when a current is passed through the DMTJ in a perpendicular to plane direction. Preferably, each of PL1, PL2, and the FL has a magnetization aligned in a perpendicular to plane (vertical) direction. When PL1 and PL2 are initialized anti-parallel to each other, there is potentially a two-fold increase in the spin torque on the FL compared with a MTJ having a single spin polarizer in a PL/TB/FL configuration, for example. As a result, there is improved spin torque transfer efficiency and a reduction in $i_C$.

In the aforementioned DMTJ, the PL1/TB1/FL stack and the FL/TB2/PL2 stack may be considered as two separate substructures, each with their individual tunneling magnetoresistive (TMR) values. In each p-MTJ substructure, the FL is free to rotate to a direction that is parallel (P state) or antiparallel (AP state) with respect to PL1 and PL2. It is important for the net magnetoresistive ratio (DRR), which is the sum of the individual TMR values, to be a large value, preferably higher than 1, as DRR is directly related to the read margin.

The magnetic performance for a DMTJ with two p-MTJ substructures is related not only to the net DRR and $i_C$, but also to $RA_1$, $RA_2$, and the stability of each magnetic layer to stray fields. Generally, in a DMTJ cell, the film uniformity including smoothness of a top surface thereof decreases with increasing distance from the substrate. In particular, the stability of PL2 magnetization in a DMTJ relies on strong antiferromagnetic (AF) coupling between AP1 and AP2 layers in an AP1/AF coupling layer/AP2 stack that provides the lowest energy state (most stable orientation) for pinning PL2 magnetization. However, strong AF coupling occurs within a narrow thickness range of the AF coupling layer that is difficult to control when PL2 is a substantial distance from the substrate. Variation in AF coupling layer thickness could result in regions of the AP1 and AP2 layers having ferromagnetic (parallel) coupling rather than AF coupling, or with varying AF coupling strength between the AP1 and AP2 layers. Also, the roughness of the underlying TB2 layer reduces the interfacial perpendicular anisotropy in PL2 at the TB2/PL2 interface thereby decreasing PMA in PL2 that lowers PL2 magnetization stability. Another issue to be addressed is that in order to obtain a stable pinned layer (PL2), it is critical for the materials in an AP1/AF coupling layer/AP2 stack to have a face centered cubic (fcc) crystal structure. However, a fcc (111) layer is not favorably grown on a TB2 barrier layer such as MgO, which has a fcc (002) texture. Even if such a crystal growth is achievable, it is detrimental to DRR of the DMTJ stack as a fcc (002) crystal texture is preferred for that purpose. Therefore, a DMTJ structure is needed where $i_C$, DRR, RA, and PL2 magnetic stability are simultaneously optimized to improve performance and fabrication yields.

SUMMARY

One objective of the present disclosure is to provide a DMTJ cell design that reduces the critical current ($i_C$) for switching the free layer to less than the $i_C$ realized with a single p-MTJ cell, and improving magnetization stability in an upper pinned layer while enabling acceptable DRR and RA for advanced MRAM and STT-MRAM devices.

A second objective is to provide a method of initializing the pinned layers and free layer in a DMTJ that is compatible with the DMTJ cell design of the first objective.

According to a first embodiment of the present disclosure, a preferred DMTJ cell also known as a dual spin filter (DSF) comprises a free layer (FL) sandwiched between a lower first tunnel barrier layer (TB1) and an upper second tunnel barrier layer (TB2), a first pinned layer (PL1) adjoining a bottom surface of TB1, and a second pinned layer (PL2) contacting a top surface of TB2. In preferred embodiments, an oxide capping layer is formed on a top surface of PL2 to enhance interfacial perpendicular anisotropy therein which leads to higher PL2 magnetization stability. In an alternative embodiment, the oxide capping layer is replaced with one or more magnetic layers having a fcc (111) texture. All magnetic layers (PL1, PL2, FL) have a magnetization in a perpendicular to plane (vertical) direction that is orthogonal to a top surface of a substrate on which the DMTJ is formed. Although PL1 may have a synthetic antiparallel (SyAP) configuration represented by AP2/AF coupling/AP1 stack of layers, PL2 is preferably a single layer or multilayer that does not rely on AF coupling for stabilization. Thus, the AP1 magnetic layer for PL1 contacts a bottom surface of TB1, and the AP2 layer is formed on a seed layer or substrate such as a bottom electrode. PL2 may be an amorphous CoFeB layer as deposited, and B diffuses away from the TB2/PL2 interface during crystallization initiated by annealing thereby providing a CoFe layer with a bcc (001) texture adjoining TB2 and having excellent lattice matching with an underlying MgO (TB2) layer with a fcc (002) structure. Thus, PL2 is designed to comprise at least a lower layer such as CoFeB that serves as a phase breaking layer in the alternative embodiment where PL2 also has an upper portion comprised of one or more layers with a fcc (111) texture. The MgO/CoFe interface ensures a high DRR for the second p-MTJ substructure in the DMTJ cell.

In the preferred embodiments, the PL2 layer or an upper portion of a PL2 multilayer with a bcc (001) texture forms an interface with the metal oxide capping layer thereby providing additional interfacial perpendicular anisotropy to enhance PMA in PL2 and higher PL2 magnetization stability. Alternatively, a metal layer such as Mo or W that has a fcc (111) texture is formed on the PL2 layer in embodiments where the upper portion of the PL2 layer has a fcc (111) texture. In some embodiments, the upper portion of PL2 may have a multilayer structure such as (Co/Ni)$_n$ or the like where "n" is the lamination number. In such a case, a 'phase breaking layer' such as Ta, Mo, or W may be inserted between the bcc (001) textured CoFeB-like layer and the fcc (111) textured (Co/Ni)$_n$ or (Co/Pt)$_n$ multilayers in order to decouple the crystallographic textures of these materials.

The DMTJ is initialized such that the PL1 AP1 layer magnetization is antiparallel to that for the PL2 magnetization to enable a lower is than a parallel alignment. Therefore, the first p-MTJ substructure has a P state while the second p-MTJ substructure has an AP state, or the first p-MTJ substructure has an AP state while the second p-MTJ substructure has a P state to give a P/AP or AP/P configuration, respectively.

An important feature is that RA of the first p-MTJ substructure hereafter referred to as $RA_1$ is substantially less than the RA of the second p-MTJ substructure hereafter referred to as $RA_2$ so that the net DRR for the DMTJ is maximized. According to some embodiments, both of TB1 and TB2 are metal oxide (MOx) or metal oxynitride (MON) layers. $RA_2$ is substantially larger than $RA_1$ because TB2 has one or both of a greater thickness than TB1, and a higher oxidation state. For example, TB2 may have a stoichiometric oxidation state where essentially all sites in the MOx lattice that are not occupied with metal atoms are filled with oxygen atoms, and TB1 may be substantially underoxidized with a plurality of sites in the MOx lattice that are not occupied by oxygen atoms. Moreover, total RA ($RA_{TOTAL}$) for the DMTJ is preferably less than 5 ohms-cm$^2$ in some embodiments meaning that $RA_1$, and $RA_{CAP}$ for the oxide capping layer (when present) must be minimized since $RA_2$ is usually the largest contributor to $RA_{TOTAL}$.

$RA_1$ and $RA_{CAP}$ may be minimized when TB1 and the oxide capping layer, respectively, are a MOx matrix or MON matrix with conductive channels formed therein to lower resistivity, or when a MOx or MON layer is doped with one of N, S, Se, P, C, Te, As, Sb, Si, Pt, Au, Ir, W, or Mo that creates conductivity states in the band gap of TB1 and the capping layer. The oxide capping layer may have a non-stoichiometric oxidation state and a thickness less than TB2.

The present disclosure also encompasses a method of forming TB1 and an oxide capping layer having a reduced $RA_1$ and $RA_{CAP}$, respectively. In addition, an initialization method is provided such that PL1 AP1 magnetization is opposite to PL2 magnetization.

DETAILED DESCRIPTION

Figure 1A:
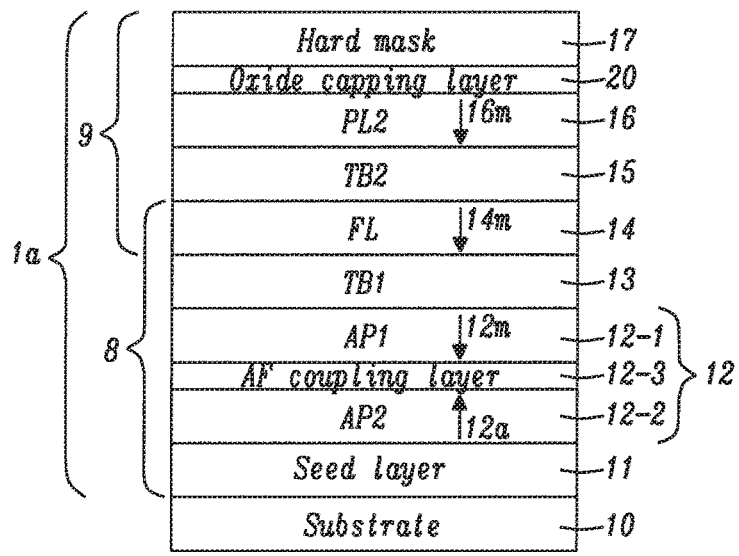
FIGS. 1A-1B are cross-sectional views of a DMTJ according to embodiments of the present disclosure wherein a lower pinned layer (PL1) has a SyAP configuration wherein a PL1 AP1 magnetization (perpendicular to plane) is aligned parallel and antiparallel, respectively, to a PL2 magnetization.

The present disclosure is a DMTJ that is configured to enable a lower critical switching current density than realized in a single spin filter while providing acceptable DRR and $RA_{TOTAL}$, and improved stability in an upper pinned layer. The DMTJ features a free layer (FL) formed between a lower tunnel barrier layer (TB1) and an upper tunnel barrier (TB2) layer wherein TB1 has a lower RA product than that of TB2. Moreover, a first pinned layer (PL1) that contacts a bottom surface of TB1 has a vertical magnetization that is aligned anti-parallel to a vertical magnetization of an upper second pinned layer (PL2) contacting a top surface of TB2. The DMTJ may be incorporated in a MRAM, STT-MRAM or another spintronic device such as a spin torque oscillator (STO), sensor, or biosensor. The term "oxidation state" refers to the oxygen content in TB1, TB2 and a capping layer comprised of a metal oxide or metal oxynitride. A top surface for a layer is defined as a surface facing away from the substrate while a bottom surface faces the substrate. An interface is a boundary region comprised of a bottom surface of one layer and an adjoining top surface of a second layer. A thickness of each DMTJ layer is in a z-axis direction while the planes of the layers are laid out in the x-axis and y-axis directions.

In related application Ser. No. 15/841,479, we disclosed various methods of minimizing RA in a metal oxide Hk enhancing layer in a p-MTJ including reducing outer portions of the metal oxide layer, or forming conductive pathways therein. Similarly, in related application Ser. No. 15/728,818, we disclosed a doped metal oxide Hk enhancing layer where the dopant is one of N, S, Se, P, C, Te, As, Sb, or Bi to fill vacant sites in a metal oxide lattice thereby lowering RA.

We disclosed a DMTJ in related application Ser. No. 16/056,791 wherein a lower TB1 tunnel barrier layer has a substantially lower $RA_1$ product than $RA_2$ for an upper TB2 tunnel barrier layer in order to generate acceptable DRR. In addition, pinned layers PL1 and PL2 have magnetizations aligned antiparallel to provide a lower switching current than realized in a single spin filter, or in a DMTJ where PL1 and PL2 have parallel alignment. However, there is still a concern regarding PL2 stability in a DMTJ where PL2 is grown on a metal oxide layer that tends to have a non-uniform top surface, and especially when PL2 has a SyAP configuration similar to PL1. In particular, the middle antiferromagnetic (AF) coupling layer tends to have variable thickness that causes portions of the adjoining AP1 and AP2 layer in PL2 to be AF coupled while other portions are ferromagnetically coupled.

Here we disclose a modification of the DMTJ described in related application Ser. No. 16/056,791 wherein a MOx or MON capping layer also known as an oxide capping layer is formed on a top surface of PL2 and below the uppermost hard mask to provide a second PL2/metal oxide interface and additional interfacial perpendicular anisotropy that enhances PMA and magnetization stability in PL2. As mentioned earlier, it is very difficult to control AF coupling layer thickness when the SyAP structure is a considerable distance from the substrate as in an upper pinned layer in a DMTJ stack. Therefore, the improved DMTJ design described herein incorporates a PL2 that is a single magnetic layer sandwiched between an adjoining oxide capping layer and TB2, or a PL2 multilayer based only on ferromagnetic (FM) coupling and comprised of a magnetic layer with a fcc (111) texture but with no adjoining oxide layer other than TB2. We disclose preferred PL2 compositions that enable acceptable DRR in the upper p-MTJ substructure simultaneously with substantial PMA for improved PL2 stability.

Referring to FIG. 1A, DMTJ 1a is shown in which an optional seed layer 11, PL1 12, TB1 13, FL 14, TB2 15, PL2 16, oxide capping layer 20, and hard mask 17 are sequentially formed on a substrate 10. PL1 is depicted with a SyAP configuration with AP2 layer 12-2 formed on the seed layer, a middle AF coupling layer 12-3, and upper AP1 layer 12-1 contacting a bottom surface of TB1. PL2 is a single layer in some embodiments, but optionally is a multilayer comprised of a lower layer 16-1 and an upper layer 16-2 described later with regard to FIG. 3C. PL1 AP1 has magnetization 12m aligned antiparallel to PL1 AP2 magnetization 12a because of AF coupling through layer 12-3, which is typically Ru with a thickness of 4 Angstroms. The DMTJ is depicted with a P/P magnetic state wherein a first p-MTJ substructure 8 has PL1 AP1 magnetization 12m aligned parallel to FL magnetization 14m (P state), and a second p-MTJ substructure 9 has PL2 magnetization 16m aligned parallel to the FL magnetization (P state).

Figure 4A:
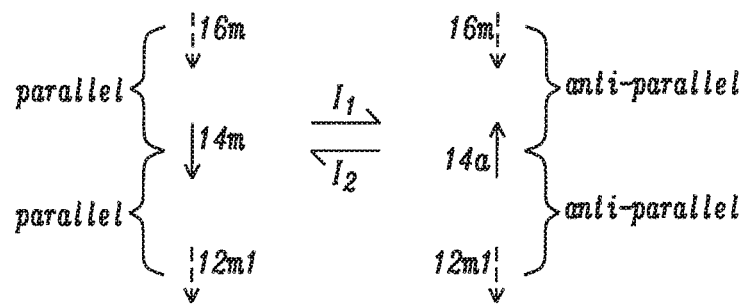
FIG. 4A depicts the DMTJ configuration in FIG. 1A where a current is applied to switch the DMTJ from a P/P state to an AP/AP state, or a reverse current switches the AP/AP state to a P/P state.

FIG. 4A shows another representation of the two parallel (P) states in FIG. 1A. When a sufficiently large write (switching) current $I_1$ is applied, FL magnetization flips from 14m to 14a thereby establishing an AP/AP state for the DMTJ where FL magnetization 14a is anti-parallel to both PL1 AP1 magnetization 12m and PL2 magnetization 16m. Since PL1 AP1 magnetization 12m and PL2 magnetization 16m are in the same direction, the spin torque effect on the FL generated by current ($I_1$ or $I_2$) passing through PL1 AP1 effectively cancels (or reduces) the spin torque effect of PL2 on the FL. As a result, a higher switching current is required for DMTJ 1a compared with a single p-MTJ 2 shown in FIG. 2. The same outcome occurs when write current $I_2$ is applied to switch DMTJ 1a from an AP/AP state to a P/P state which means the magnetic orientations of PL1 AP1, PL2, and the FL in FIG. 4A are unfavorable in terms of the desired outcome of a reduced switching current compared with a single p-MTJ structure. Hereinafter, the magnetic orientations of the PL1 AP1, PL2, and FL layers in FIG. 1A are referred to as a non-working state with regard to the objective of designing a DMTJ having a lower is than p-MTJ 2.

Figure 1B:
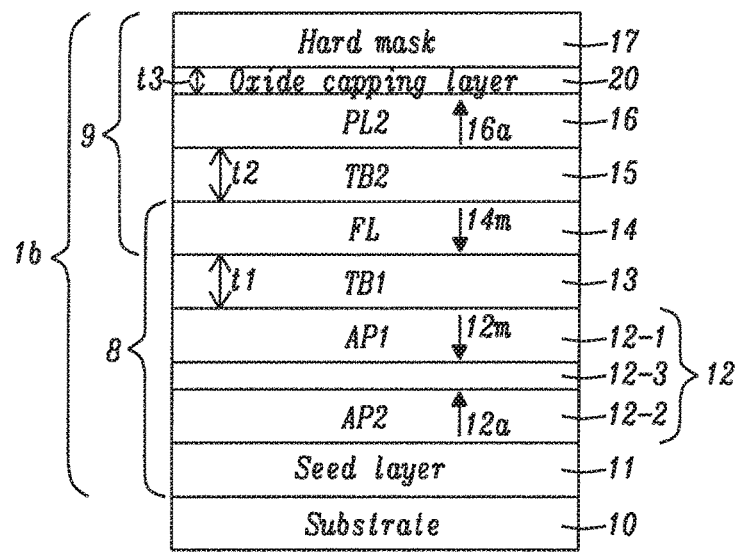

FIG. 1B illustrates an alternative configuration shown as DMTJ 1b for the magnetizations in PL1 AP1 12-1, PL2 16, and FL 14. Here, PL1 AP1 magnetization 12m is antiparallel to PL2 magnetization 16a while FL magnetization 14m is aligned parallel to PL1 AP1 magnetization 12m and anti-parallel to PL2 magnetization 16a to give a P state for p-MTJ substructure 8 and an AP state for p-MTJ substructure 9 that is hereinafter referred to as a P/AP state for DMTJ 1b. Otherwise, all layers in the DMTJ 1b are retained from FIG. 1A.

Figure 4B:
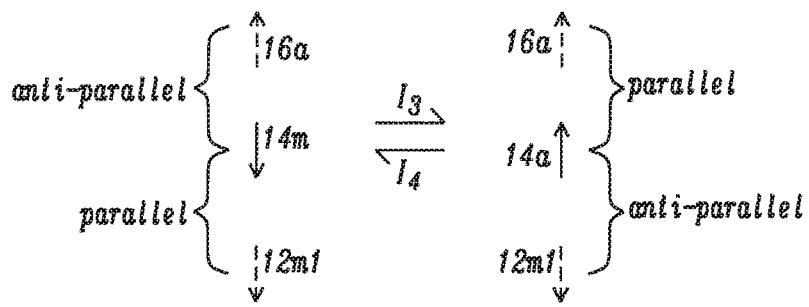
FIG. 4B depicts the DMTJ configuration in FIG. 1B where a current is applied to switch the DMTJ from a P/AP state to an AP/P state, or a reverse current switches an AP/P state to a P/AP state.

In FIG. 4B, another representation of the P/AP state in FIG. 1B is depicted. Here, write current $I_3$ is applied to switch FL magnetization 14m to 14a thereby establishing an AP/P state for the DMTJ 1b where FL magnetization is now antiparallel to PL1 AP1 magnetization 12m but parallel to PL2 magnetization 16a in the absence of an external magnetic field. As a result, a lower switching current is required for the DMTJ compared with a single p-MTJ since the spin torque effect generated by current passing through PL1 AP1 is added to the spin torque effect on the FL magnetization from PL2 because magnetizations 12m, 16a are anti-parallel. Thus, the magnetic orientations of PL1 AP1, PL2, and the FL in FIG. 1B are favorable to reduce the critical switching current relative to a single p-MTJ, and compared with DMTJ 1a in FIG. 1A. DMTJ 1b in FIG. 1B and FIG. 4B is hereinafter referred to as a working state for the purpose of achieving the objectives of the present disclosure. Note that the same desirable outcome is realized by applying write current $I_4$ to switch FL magnetization 14a to 14m in FIG. 4B and change the DMTJ from an AP/P state to a P/AP state.

Figure 2:
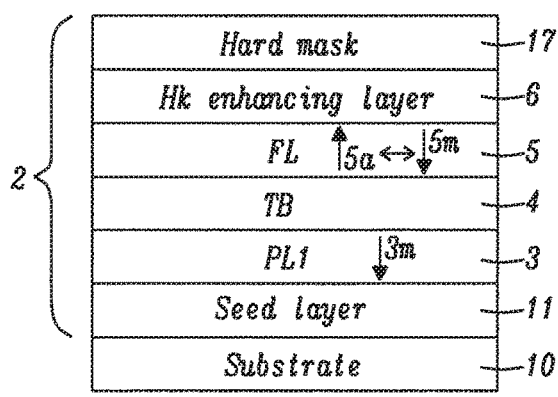
FIG. 2 is a cross-sectional view of a single p-MTJ in the prior art.

Referring to FIG. 2, a single spin filter (p-MTJ 2) is depicted wherein seed layer 11, pinned layer 3, tunnel barrier 4, free layer 5, optional Hk enhancing layer 6, and hard mask 17 are sequentially formed on substrate 10. The Hk enhancing layer is typically a MgO layer that is advantageously used to form a second metal oxide interface with the FL thereby enhancing PMA and thermal stability. A critical current (not shown) is applied to switch the p-MTJ from a P state where FL magnetization 5m and PL magnetization 3m are parallel to an AP state where FL magnetization 5a and PL magnetization 3m are antiparallel, or from an AP state to a P state.

Returning to FIG. 1B, optimum performance is achieved when $RA_1$ of TB1 13 is less than $RA_2$ of TB2 15. Furthermore, in preferred embodiments, $RA_{TOTAL}$ for DMTJ 1b is <5 ohm-cm², and is equal to the sum $(RA_1+RA_2+RA_{CAP})$ where $RA_{CAP}$ is the RA product for capping layer 20. As the difference $(RA_2-RA_1)$ increases, the net DRR for DMTJ also increases. Since $RA_2$ provides the largest contribution to $RA_{TOTAL}$, $RA_{CAP}$ is preferably minimized to avoid an unacceptably high $RA_{TOTAL}$ that tends to reduce device lifetime. $RA_{CAP}$ is also a parasitic resistance that degrades net DRR as shown in equation (2) below, and is ideally proximate to 0.

The net DRR for DMTJ 1b (FIG. 1B) is equal to the sum (DRR1+DRR2) where DRR1 is the DRR contribution from p-MTJ substructure 8 and DRR2 is the DRR contribution from p-MTJ substructure 9. It should be understood that when PL1 AP1 magnetization 12m is aligned antiparallel to PL2 magnetization 16a, DRR1 and DRR2 have opposite signs meaning that the sum is smaller than the larger of the two values.

$$DRR1 = \frac{R_{AP} - R_P}{R_P} \text{ where } R_{AP} = R_{AP}^{TB1} \text{ and } R_P = R_P^{TB1} \quad \text{Eq. (1a)}$$

$$DRR2 = \frac{R_{AP} - R_P}{R_P} \text{ where } R_{AP} = R_{AP}^{TB2} + R_{AP}^{cap} \text{ and } R_P = R_P^{TB2} + R_P^{cap} \quad \text{Eq. (1b)}$$

In equations 1a and 1b, $R_{AP}^{TB1}$ and $R_P^{TB1}$ are the resistances for the AP state and P state, respectively, in p-MTJ substructure 8, and $R_{AP}^{TB2}$ and $R_P^{TB2}$ are the resistances for the AP state and P state, respectively, in p-MTJ substructure 9.

$$\text{Since } R_{AP}^{cap} = R_P^{cap}, \text{ then} \quad \text{Eq. (2)}$$

$$\text{net } DRR = \frac{R_{AP}^{TB1} + R_{AP}^{TB2} + R_{AP}^{cap} - (R_P^{TB1} + R_P^{TB2} + R_P^{cap})}{R_P^{TB1} + R_P^{TB2} + R_P^{cap}} = \frac{R_{AP}^{TB1} + R_{AP}^{TB2} - R_P^{TB1} - R_P^{TB2}}{R_P^{TB1} + R_P^{TB2} + R_P^{cap}}$$

According to one embodiment, the conditions $RA_1<RA_2$ and $RA_{CAP}<RA_2$ are realized by one or both of a smaller thickness for TB1 (t1<t2) and a smaller thickness for the capping layer (t3<t2) than TB2, and a lower oxidation state for TB1 and the oxide capping layer compared with TB2. Because the roughness (non-uniformity) of a DMTJ layer generally increases with increasing distance from substrate 10, and a thin metal oxide layer is preferably grown (deposited) on a more uniform surface to prevent pinholes, TB1 is preferably deposited before FL 14 and TB2. Each of TB1, TB2, and the oxide capping layer may be deposited using a radio frequency (RF) based physical vapor deposition (PVD) to ensure a substantially uniform metal oxide or metal oxynitride layer.

Seed layer 11 is formed on substrate 10 that may comprise a bottom electrode and a substructure (not shown) including a bit line (or source line), and a transistor that are electrically connected to the BE through vias. The seed layer serves to induce or enhance perpendicular magnetic anisotropy (PMA) in overlying PL1 12 and is preferably comprised of one or more of NiCr, Ta, Ru, Ti, TaN, Cu, Mg, or other materials typically employed to promote a smooth and uniform grain structure in overlying layers.

PL1 12 may be a single ferromagnetic (FM) layer that is one or both of Co and Fe, or an alloy thereof with one or both of Ni and B, or may be a laminated stack with inherent PMA such as $(Co/Ni)_n$, $(CoFe/Ni)_n$, $(Co/NiFe)_n$, $(Co/NiCo)_n$, $(Co/Pt)_n$, $(Co/Pd)_n$, or the like where n is the lamination number. In preferred embodiments, PL1 has a SyAP structure for greater stability wherein AF coupling layer 12-3 is formed between AP2 12-2 and AP1 12-1. Each of the AP1 and AP2 layers may have one or more layers comprised of Co, Fe, or an alloy thereof with one or both of Ni and B. In alternative embodiments, each of AP1 and AP2 is a laminated stack comprised of $(Co/Ni)_n$, $(CoFe/Ni)_n$, $(Co/NiFe)_n$, $(Co/NiCo)_n$, $(Co/Pt)_n$, $(Co/Pd)_n$, or the like. Although Ru is typically selected as the AF coupling layer, other metals such as Rh and Jr may be employed as AF coupling layer 12-3. Furthermore, a transitional layer such as CoFeB or Co may be inserted between the uppermost layer in the laminated stack and TB1. Antiparallel orientation of AP1 and AP2 layers becomes the lowest energy state when a Ru AF coupling layer has an appropriate thickness, which is about 4 Angstroms. Thus, the stability of the SyAP structure (orientation of magnetizations 12m and 12a) depends on the magnitude of the exchange interaction from AF coupling, and on the anisotropy energy (perpendicular magnetic anisotropy or PMA) in the AP1 and AP2 layers.

Figure 3A:
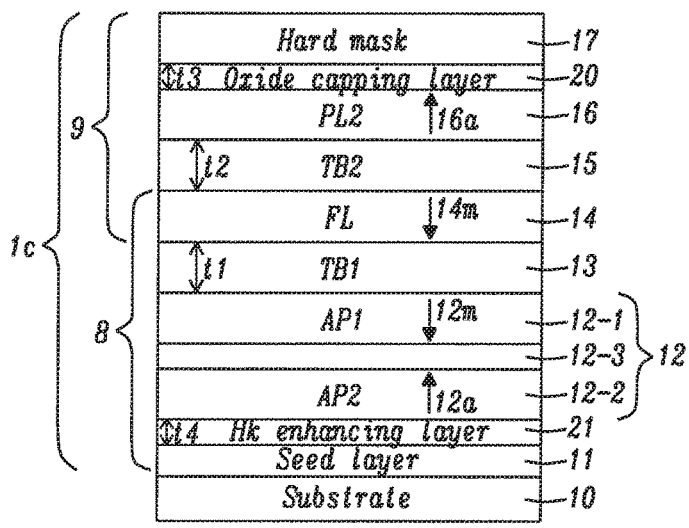
FIGS. 3A-3B are cross-sectional views of the DMTJ in FIG. 1B that has been modified to include an Hk enhancing layer that adjoins a bottom surface of the PL1 AP2 layer, which is a single layer, or where a PL1 AP2 bilayer is formed directly on the seed layer, respectively, according to embodiments of the present disclosure.
Figure 3B:
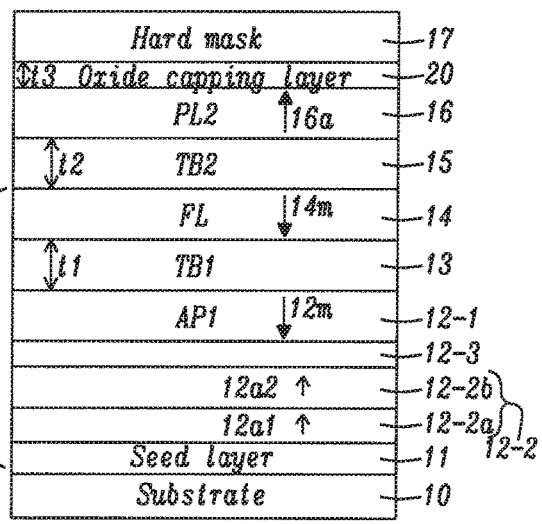

Referring to FIG. 3A, an embodiment of the present disclosure is depicted that represents a modification of DMTJ 1a wherein PMA is enhanced in the PL1 AP2 layer 12 by inserting a metal oxide Hk enhancing layer between seed layer 11 and the AP2 layer to yield DMTJ 1c. The AP2 layer may be a single layer such as CoFeB, CoB, or FeB. In an alternative embodiment shown in FIG. 3B, AP2 layer 12-2 in DMTJ 1a may be replaced with a bilayer stack wherein a lower AP2 layer 12-2a such as a laminated stack of $(Co/Ni)_n$ or the like having a fcc (111) texture (to enhance PMA and thermal stability within the PL2 layer) is deposited on the seed layer, and an upper AP2 layer 12-2b that may be CoFeB contacts a bottom surface of AF coupling layer 12-3 to yield DMTJ 1d. In another embodiment, AP2 layer 12-2a may be a $Co_xFe_yB$ layer where either x or y may be 0, and AP2 layer 12-2b is a laminated stack of $(Co/Ni)_n$ or the like with inherent PMA. Note that magnetization 12a1 in the lower AP2 layer is ferromagnetically coupled to magnetization 12a2 in the upper AP2 layer.

In this case, DMTJ 1c has $RA_{TOTAL}=(RA_{Hk}+RA_1+RA_2+RA_{CAP})$ where $RA_{Hk}$ is the RA product for Hk enhancing layer 21 while DMTJ 1d has $RA_{TOTAL}=(RA_1+RA_2+RA_{CAP})$. Thus, it is important to minimize $RA_{Hk}$ (when present), as well as $RA_1$, and $RA_{CAP}$ since $RA_2$ is generally the largest contributor to $RA_{TOTAL}$ in view of one or both of having a higher oxidation state (where the metal:oxygen ratio is proximate to 1:1) than TB1 13, and oxide capping layer 20, and having thickness t2 greater than t1 and t3. Here, both of $RA_{Hk}$ and $RA_{CAP}$ are ideally proximate to 0 since both are associated with a parasitic resistance that degrades the net DRR for DMTJ 1c. Furthermore, in FIG. 3A, the AP2 layer is preferably amorphous as deposited but forms a bcc (001) crystal structure during annealing thereby enabling favorable lattice matching with the underlying metal oxide that typically has a fcc (002) texture.

The net DRR for DMTJ 1c in FIG. 3A is represented by equation 3 below.

$$\text{net } DRR = \frac{R_{AP}^{TB1} + R_{AP}^{TB2} - R_P^{TB1} - R_P^{TB2}}{R_P^{TB1} + R_P^{TB2} + R_P^{cap} + R_P^{HK}} \quad \text{Eq. (3)}$$

where $R_P^{Hk}$ is the resistance in the P state for p-MTJ substructure 8. In this case, both of $R_P^{cap}$ and $R_P^{Hk}$ are considered to be parasitic in that they degrade net DRR, and therefore each should be minimized to a value proximate to zero for optimum DMTJ performance. The net DRR for DMTJ 1d (FIG. 3B) is also calculated using equation 3 where the $R_P^{Hk}$ term is set to 0.

One important feature of all embodiments described herein is that PL1 magnetization 12m is antiparallel to PL2 magnetization 16a depicted in the working state in FIG. 1B. An initialization method for setting the antiparallel alignment is described in a later section.

Another key feature of all embodiments of the present disclosure is that $RA_1$ for TB1 13 is substantially less than $RA_2$ for TB2 15 in order to provide an acceptable net DRR for DMTJ 1b (or DMTJ 1c, 1d, or 1e), and each of $RA_1$ (when applicable) and $RA_{CAP}$ is substantially less than $RA_2$ such that $RA_{TOTAL}$ defined previously is minimized. Accordingly, each of TB1, TB2, and Hk enhancing layer 21 (when present) are preferably a metal oxide or metal oxynitride wherein the metal is selected from one or more of Mg, Ti, Al, Zn, Zr, Hf, and Ta, or are a lamination of one or more of the aforementioned metal oxides or metal oxynitrides. According to a preferred embodiment, TB2 has a stoichiometric oxidation state wherein essentially all metal atoms are completely oxidized with no vacant sites in the metal oxide lattice in order to enhance $RA_2$. Meanwhile, TB1, the oxide capping layer, and the Hk enhancing layer (when present) preferably have a non-stoichiometric oxidation state wherein a certain number of metal atoms are not completely oxidized, and substantially higher conductivity than TB2 so that $RA_1$, $RA_{CAP}$, and $RA_{Hk}$, respectively, are substantially less than $RA_2$. As mentioned earlier, the desirable outcome of $RA_2 > RA_1$, and $RA_2 > RA_{CAP}$ is generally achieved when t2 of TB2>t1 of TB1, and t2>t3 of the oxide capping layer. In embodiment shown in FIG. 3A, the Hk enhancing layer preferably has one or both of a lower thickness (t4) than t2, and a lower oxidation state than TB2.

TB1 13, TB2 15, oxide capping layer 20, and Hk enhancing layer 21 may be fabricated with a radio frequency (RF) physical vapor deposition (PVD) process using a MOx or MON target. In some embodiments, TB2 is formed by first depositing a Mg layer (not shown) on FL 14 with a PVD or RF PVD method. Then, the Mg layer may be oxidized with a natural oxidation (NOX) process where the Mg layer is exposed to a flow of oxygen for a certain period of time. Thereafter, an optional second Mg layer is deposited by a PVD or RF PVD method. During subsequent processes including one or more anneal steps, the second Mg layer becomes oxidized so that the MgO/Mg intermediate stack forms an essentially uniform MgO layer. A similar sequence may be used to form TB1 on PL 12, or the oxide capping layer on PL2 16, or the Hk enhancing layer on seed layer 11 wherein the first metal and subsequent metal layers are Mg or an alternative metal. The present disclosure anticipates that the metal (M) in a TB2 MOx or MON layer may not be the same metal as in TB1 or in the oxide capping layer. For example, M is preferably Mg in a TB2 layer, but a MOx or MON TB1 layer may not contain Mg so that DRR for p-MTJ substructure 8 is minimized relative to the DRR for p-MTJ substructure 9 as explained later. Moreover, the metal in the oxide capping layer may be one or more of Mg, Al, Ta, Ti, Co, Fe, B, and Ru. RuOx is beneficial in enhancing conductivity in the oxide capping layer while an oxide of one or more of Co, Fe, and B may be formed with oxidation of an upper portion of a CoFeB PL2 layer.

In other embodiments, all DMTJ layers may be deposited with a PVD process in a sputter deposition chamber of a sputter deposition mainframe containing a plurality of deposition chambers and at least one oxidation chamber. Each PVD step is typically performed in an environment comprised of a noble gas such as Ar, and with a chamber pressure that is $5 \times 10^{-8}$ and $5 \times 10^{-9}$ torr.

Figure 3C:
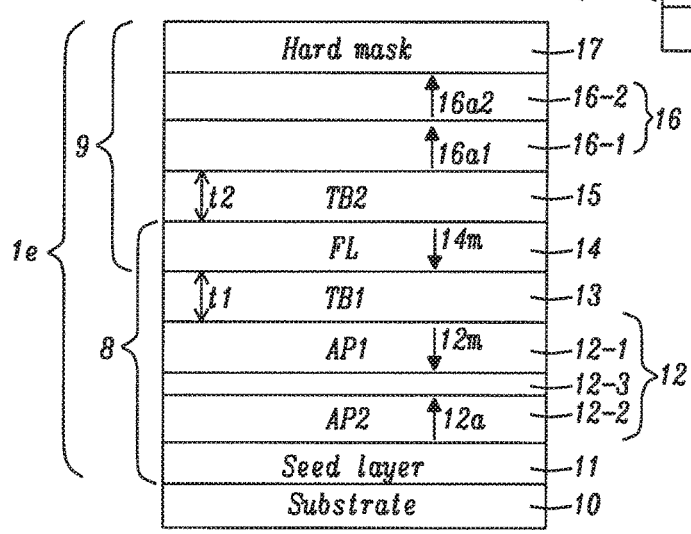
FIG. 3C is a cross-sectional view of the DMTJ in FIG. 1B that is modified to have a PL2 bilayer with a magnetic layer having fcc (111) texture, and no oxide capping layer according to another embodiment of the present disclosure.

In the embodiments shown in FIGS. 1A-1B, and FIGS. 3A-3B, each of FL 14 and PL2 16 may be a single layer that is Co, Fe, CoFe, or an alloy thereof with one or both of B and Ni. In other embodiments, the FL is a multilayer stack comprising a combination of the aforementioned compositions. FIG. 3C depicts an alterative embodiment where PL2 is a multilayer with a composition described in a later section, and the oxide capping layer is omitted. In another embodiment, the FL may have a non-magnetic moment diluting layer such as Ta or Mg inserted between two CoFe or CoFeB layers that are ferromagnetically coupled. In an alternative embodiment, the FL has a SyAP configuration such as FL1/Ru/FL2 where FL1 and FL2 are two magnetic layers that are antiferromagnetically coupled, or is a laminated stack with inherent PMA described previously with respect to PL1 composition. Each of the FL, PL1 AP1, PL1 AP2, and PL2 typically has a thickness between 10 and 30 Angstroms to enable PMA to overcome the demagnetization energy therein such that FL magnetization 14m, PL1 AP1 magnetization 12m, PL1 AP2 magnetization 12a, and PL2 magnetization 16a are perpendicular to the substrate in the absence of an external field.

Oxide capping layer 20 may be one or more of MgO, AlOx, TaOx, TiOx, FeOx, CoOx, BOx, and RuOx, or a metal oxynitride of one or more of Mg, Al, Ta, Ti, Fe, Co, B, and Ru. The capping layer may be an oxide of one or more of Co, Fe, and B that is formed by oxidizing an upper portion of an underlying CoFeB PL2 layer, for example. The oxidation may be performed with a process comprised of flowing oxygen or a mixture of $O_2$ with Ar, Kr, Xe, $N_2$, or He, or combinations thereof through a chamber wherein the substrate 10 with an overlying DMTJ stack of layers including an uppermost PL2 layer is held on a vacuum chuck. It should be noted that the chamber may be continually pumped with a vacuum pump, or one or more of the aforementioned gases are flowed through the chamber without applying a vacuum.

In some embodiments, oxide capping layer 20 may be one of the aforementioned metal oxides that is doped with Pt, Jr, Mo, Fe, CoFeB, Ta, Ti, B, W, Cu, Ag, Pd, Ru, Al, or other metals described later with respect to FIG. 5A to create shorting paths (conductive channels) that extend from PL2 16 to the hard mask 17. Alternatively, the oxide capping layer and TB1 are doped with one of N, S, Se, P, C, Te, As, Sb, Si, Pt, Au, Jr, W, or Mo that creates conductivity states in the band gap of TB1 and the oxide capping layer. According to one embodiment, the oxide capping layer is sputter deposited from a metal oxide target using a RF PVD process. Alternatively, a metal or alloy target is sputter deposited in a reactive oxygen environment to yield a metal oxide capping layer, or in a reactive oxygen and nitrogen environment to produce a metal oxynitride capping layer.

Hard mask 17 is non-magnetic and generally comprised of one or more conductive metals or alloys including but not limited to Ta, Ru, TaN, Ti, TiN, and W. It should be understood that other hard mask materials including MnPt may be selected in order to provide high etch selectivity relative to underlying DMTJ layers during an etch process that forms DMTJ cells with sidewalls that stop on the substrate 10. Moreover, the hard mask may include an electrically conductive oxide such as RuOx, ReOx, IrOx, MnOx, MoOx, TiOx, or FeOx.

We described in related application Ser. No. 16/056,791 how the net DRR for a P/AP or AP/P state in FIG. 1B is enhanced as the difference ($RA_2$–$RA_1$) becomes larger. As mentioned earlier relating to embodiments of the present disclosure, $RA_{CAP}$ and $RA_F$& (when present) factor into the net DRR in contributing a parasitic resistance that diminishes the net DRR.

Figure 5A:
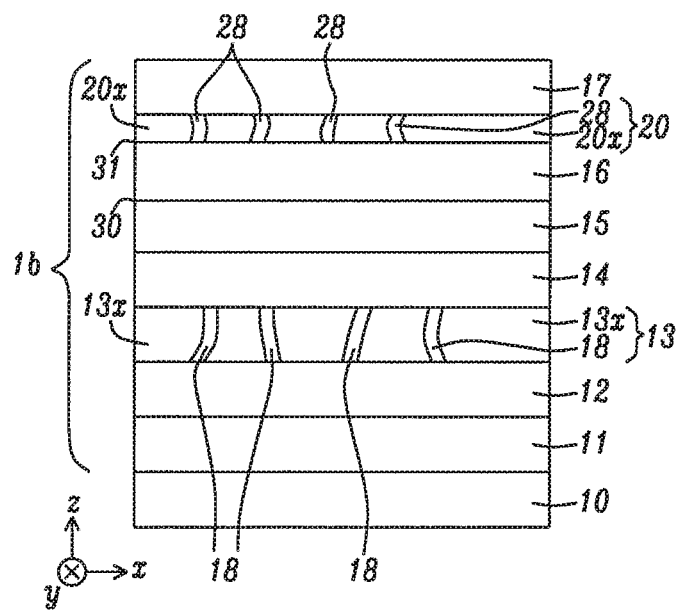
FIGS. 5A-5B depict DMTJs wherein TB1 and the oxide capping layer in FIG. 1B and FIG. 3A, respectively, have a lower RA than the TB2 layer because of conductive channels formed within an insulator matrix according to an embodiment of the present disclosure.

According to another embodiment shown in FIG. 5A, $RA_1$ in TB1 is engineered to be substantially lower than $RA_2$ in TB2 by forming conductive channels 18 in a MOx or MON matrix 13x to give a composite TB1 13. Likewise, oxide capping layer 20 may be comprised of conductive channels 28 in a metal oxide or metal oxynitride matrix 20x to reduce $RA_{CAP}$ substantially less than $RA_2$. Moreover, thickness t1 of TB1 and t3 of the oxide capping layer are preferably less than t2 of TB2. Conductive channels 18, 28 are comprised of a metal or alloy (M2) selected from one or more of Pt, Au, Ag, Mg, Al, Ca, Sr, Ba, Sc, Y, La, Co, Fe, B, Mn, Mo, Ru, Rh, Jr, Ni, Pd, Zn, Cu, Ti, V, Cr, Zr, Nb, Mo, Hf, Ta, Os, and W. Conductive channels may have a dimension (width) in the in-plane direction that varies from a single atom to a plurality of atoms, and may have an in-plane component in addition to a substantially vertical (perpendicular to plane) direction. Conductive channels 18 extend from the PL1 12 to FL 14, and conductive channels 28 extend from a top surface of PL2 16 to hard mask 17.

In the embodiment shown in FIG. 3C, PL2 is shown with a bilayer stack including a lower magnetic layer 16-1, and an upper magnetic layer 16-2. Preferably, the lower magnetic layer is a so-called phase breaking layer that has lattice matching with the underlying TB2 fcc (002) structure. In some embodiments, the lower magnetic layer is one or more of Co, Fe, and Ni, or alloys thereof with B such as CoFeB, CoB, and FeB that is deposited as an amorphous layer. However, during one or more annealing steps, B diffuses away from the TB2 interface such that a TB2/CoFe (or TB2/Co or TB2/Fe) interface 30 is formed wherein CoFe (or Co or Fe) has a crystalline bcc (001) texture with excellent lattice matching to the TB2 layer. According to one embodiment, the upper magnetic layer 16-2 is a laminated stack of layers with a $(Co/Ni)_n$, $(CoFe/Ni)_n$, $(Co/NiFe)_n$, $(Co/NiCo)_n$, $(Co/Pt)_n$, $(Co/Pd)_n$, or the like composition where n is a lamination number, and has a fcc (111) texture. The present disclosure also anticipates that a phase breaking layer (not shown) that is a metal such as Ta, Mo, or W may be inserted between the bcc (001) textured lower magnetic layer and the fcc (111) textured and laminated upper magnetic layer in order to decouple the crystallographic textures of magnetic layers 16-1 and 16-2.

There are two important benefits of the PL2 bilayer scheme. First, lattice matching at the TB2/CoFe (or TB2/Fe) interface 30 provides a large DRR value for the upper p-MTJ substructure 9. Secondly, the laminated stack has inherent PMA thereby promoting stability of PL2 layer 16 without increasing $RA_{TOTAL}$. Each of the PL2 layers has a magnetization ($16a1$ for layer 16-1, and $16a2$ for layer 16-2) in the same direction (ferromagnetic coupling) that contributes to the net PL2 magnetization.

Figure 5B:
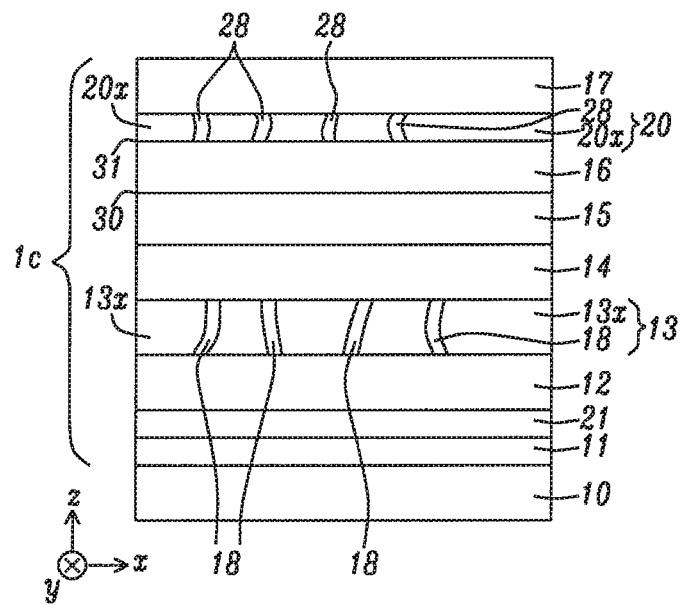

FIG. 5B represents a modification of DMTJ 1c in FIG. 3A wherein Hk enhancing layer 21 with thickness t4 is present between seed layer 11 and PL1 layer 12. Otherwise, all aspects of the DMTJ 1b in FIG. 5A are retained. Although not shown, the Hk enhancing layer may have conductive channels formed in a metal oxide or metal oxynitride matrix similar to the structure previously described for TB1 layer 13 and oxide capping layer 20 in FIG. 5A.

Figure 6:
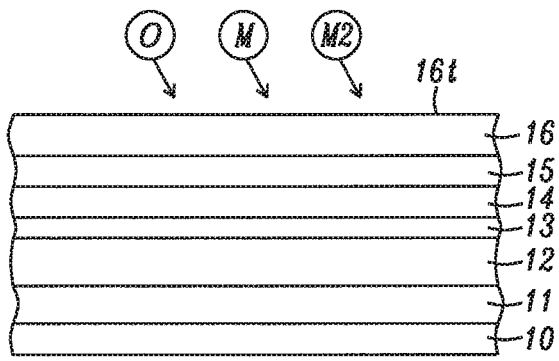
FIGS. 6-8 are cross-sectional views depicting various methods of forming conductive channels in a metal oxide (MO$_X$) matrix according to embodiments of the present disclosure.

Referring to FIG. 6, a method similar to that described for forming a doped metal oxide layer in related patent application Ser. No. 15/728,818 may be employed to fabricate conductive channels in an insulator matrix for TB1 13 and oxide capping layer 20 in FIGS. 5A-5B. According to one embodiment, conductive pathways made of M2 metal or alloy are formed in a MOx matrix in a reactive gas environment generated by a chemical vapor deposition (CVD), physical vapor deposition (PVD), or a plasma enhanced CVD (PECVD) method wherein the metal M species, metal or alloy M2 species, and oxygen O species are simultaneously directed at top surface 16t of PL2 16, and form a film thereon. A similar process may be employed to form TB1 layer 13 or Hk enhancing layer 21 when said layers are comprised of conductive channels in a MOx matrix. The conductive pathways may be formed during the CVD, PVD, or PECVD process, or during a subsequent anneal step that promotes M2 diffusion and conglomeration within the MOx matrix. It should be understood that the reactive gas environment further includes nitrogen species when a MON matrix is desired. According to the present disclosure, the term species comprises one or more of a neutral atom or molecule, radicals, and positive or negative ions.

Figure 7:
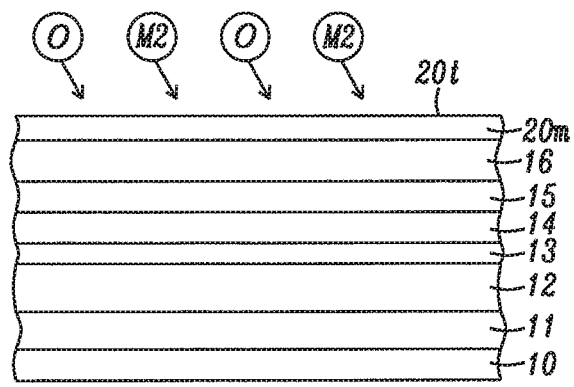

According to a second embodiment shown in FIG. 7, a metal layer 20m wherein the metal is one or more of Mg, Al, Ta, Ti, Fe, Co, B, or Ru with top surface 20t is deposited on PL2 layer 16 during a first step. Then, a second step is performed where the reactive gas environment mentioned in the previous embodiment is limited to oxygen O species and the M2 species thereby affording conductive M2 channels 28 in a metal oxide matrix 20x, or is limited to N, O, and M2 species to form M2 channels in a metal oxynitride matrix. Again, the conductive channels may be formed during a CVD, PVD, or PECVD process, or after a deposited film (not shown) that is a composite of metal M, M2 and O is annealed to induce diffusion and conglomeration of the M2 atoms into distinct pathways 28.

Figure 8:
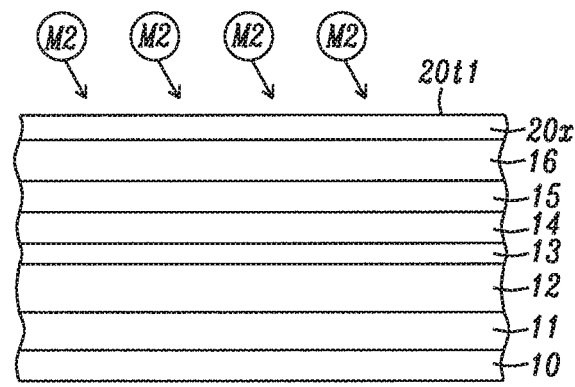

In FIG. 8, a third embodiment for conductive channel formation in an insulator matrix is provided. First, a metal oxide (or metal oxynitride) layer 20x wherein the metal is one or more of Mg, Al, Ta, Ti, Fe, Co, B, or Ru and having top surface 20t1 is formed on PL2 16. Note that the metal oxide or metal oxynitride layer may be formed by a sequence involving deposition of one or more metal layers followed by an oxidation step such as a natural oxidation (NOX) process where each of the one or more metal layers is exposed to a flow of oxygen (or $O_2$ and $N_2$) in a reaction chamber to partially or completely oxidize all metal atoms in the metal layer(s). Alternatively, a metal oxide layer (or metal oxynitride layer) is formed with a conventional radical oxidation (or radical oxynitridation) process of a metal layer. Thereafter, a reactive gas environment comprised of M2 species is employed to form conductive channels 28 in the metal oxide or metal oxynitride layer. In some embodiments, a M2 layer may be formed on the intermediate metal oxide or metal oxynitride layer, and then a subsequent anneal step is used to diffuse the M2 layer into the insulator layer followed by conglomeration into conductive M2 channels within an insulator matrix.

Figure 9:
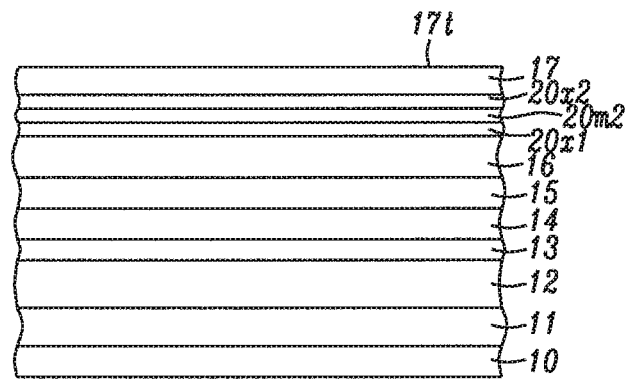
FIG. 9 is a cross-sectional view depicting an intermediate step in forming an oxide capping layer having a substantially lower RA product than an upper tunnel barrier (TB2) layer in a DMTJ.

Referring to FIG. 9, the present disclosure also anticipates a fourth method of forming conductive channels in a metal oxide or metal oxynitride matrix. Seed layer 11, PL1 12, TB1 13, FL 14, TB2 15, and PL2 16 are sequentially formed on substrate 10. Then a first metal oxide or metal oxynitride layer 20x1 wherein the metal is one or more of Mg, Al, Ta, Ti, Fe, Co, B, or Ru, a M2 layer 20m2, and a second metal oxide or metal oxide layer 20x2 with a composition equivalent to layer 20x1 are sequentially formed on the PL2 layer to provide an intermediate trilayer stack. Alternatively, either the first layer 20x1 or third layer 20x2 may be omitted to yield a bilayer intermediate stack. Thereafter, hard mask 17 is deposited on the uppermost layer in the intermediate bilayer or trilayer stack. The resulting intermediate DMTJ stack of layers in FIG. 9 is transformed into DMTJ 1b in FIG. 1B by performing one or more anneal steps during fabrication of the memory device. For example, a first anneal step may occur before patterning the DMTJ stack into a plurality of DMTJ cells, and a second anneal step may be performed after patterning the DMTJ stack of layers. The one or more anneal steps transform the bilayer or trilayer stack into an oxide capping layer having conductive channels in an insulator matrix.

In all embodiments shown in FIGS. 6-9, a key feature is that the metal has a higher affinity for oxygen than M2 such that the metal is selectively oxidized in the presence of M2. Accordingly, M2 is a metal in the table in FIG. 14 preferably having a less negative free energy of oxide formation value than metal M, which is typically Mg for TB2 15. However, the metal M in TB1 13 and capping layer 20 may not be Mg in order to provide a lower $RA_1$ and $RA_{CAP}$ than realized with a MgO or MgON matrix.

Figure 10:
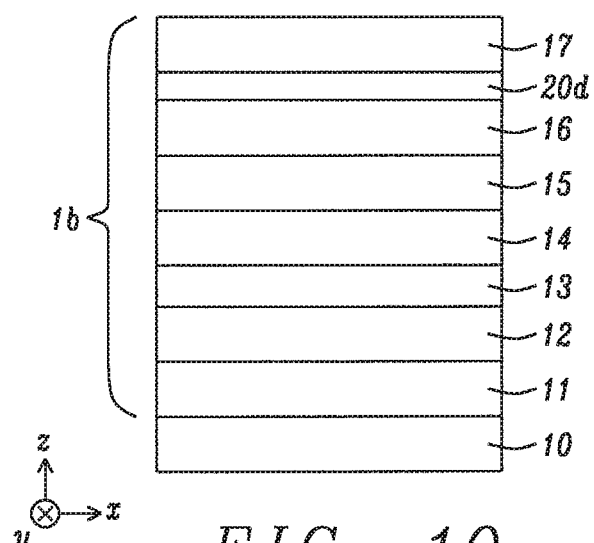
FIG. 10 is a cross-sectional view wherein the oxide capping layer in FIG. 1B contains a dopant thereby providing a lower $RA_{CAP}$ than $RA_2$ in TB2 by creating conductivity states in the capping layer band gap according to an embodiment of the present disclosure.

Referring to FIG. 10, another embodiment of the present disclosure is depicted where oxide capping layer 20 in DMTJ 1b is a doped metal oxide layer 20d wherein the dopant (D) content is from 100 ppm up to 20 atomic %. As we disclosed in related application Ser. No. 15/728,818, a dopant (D) that is one of N, S, Se, P, C, Te, As, Sb, Bi, Si, Pt, Au, Jr, W, or Mo may be introduced in a metal oxide layer to fill vacant sites in a metal oxide lattice thereby lowering the RA product. Thus, the dopant will create conducting states in the band gap of a metal oxide layer, for example, through hole generation while providing an additional advantage of blocking oxygen diffusion hopping through otherwise vacant sites in the MOx layer with a non-stoichiometric oxidation state. In an alternative embodiment, layer 20d may be a doped metal oxynitride layer wherein the D content is from 100 ppm to 20 atomic %.

One of the methods that may be employed to form the doped metal oxide layer is represented by a process shown in one of FIGS. 6-8 wherein the M2 species is replaced by a dopant species, and the metal M is one or more of Mg, Al, Ta, Ti, Fe, Co, B, or Ru. Furthermore, a multistep sequence comprising an intermediate stack shown in FIG. 9 may be used where layer 20m2 is comprised of a dopant rather than a M2 metal or alloy. Thereafter, one or more anneal steps may be performed to diffuse the dopant layer into one or both of the metal oxide layers 20x1, 20x2. In some embodiments, layer 20m2 may be an alloy comprised of oxygen, the dopant, and a metal that is one or more of Mg, Al, Ta, Ti, Fe, Co, B, or Ru. Preferably, the dopant is one of N, S, Se, P, C, Te, As, Sb, Bi, Si, Pt, Au, Jr, W, or Mo. Note that layers 20x1, 20x2 are made of metal oxynitride (MON) when a doped MON capping layer is desired.

It should be understood that when TB1 13 in FIG. 1B is a MOx or MON layer having one or both of a smaller thickness and a lower oxidation state than TB2, oxide capping layer 20 may be comprised of conductive channels 28 in a metal oxide or metal oxynitride matrix 20x as shown in FIGS. 5A-5B, or comprised of a doped metal oxide or doped metal oxynitride layer. Likewise, when the oxide capping layer is a metal oxide or metal oxynitride layer, and has one or both of a smaller thickness and lower oxidation state than TB2, TB1 may be comprised of conductive channels 18 in a MOx or MON matrix 13x, or comprised of a doped MOx or MON layer. Thus, it is not necessary for both TB1 and the oxide capping layer to simultaneously have conductive channels in an insulator matrix, or both be comprised of a doped MOx or MON layer.

In the alternative embodiments shown in FIG. 3A and FIG. 5B, Hk enhancing layer 21 may be a doped MOx layer containing a dopant D such as N, S, Se, P, C, Te, As, Sb, Bi, Si, Pt, Au, Jr, W, or Mo to reduce $RA_{HK}$ while TB1 13 and capping layer 20 comprise the dopant D, or are made of conductive channels in a MOx or MON matrix to lower $RA_1$ and $RA_{CAP}$, respectively, compared with $RA_2$ in TB2 15. Accordingly, the method of reducing $RA_1$ may be different from the method to reduce $RA_1$ and $RA_{CAP}$.

Figure 11:
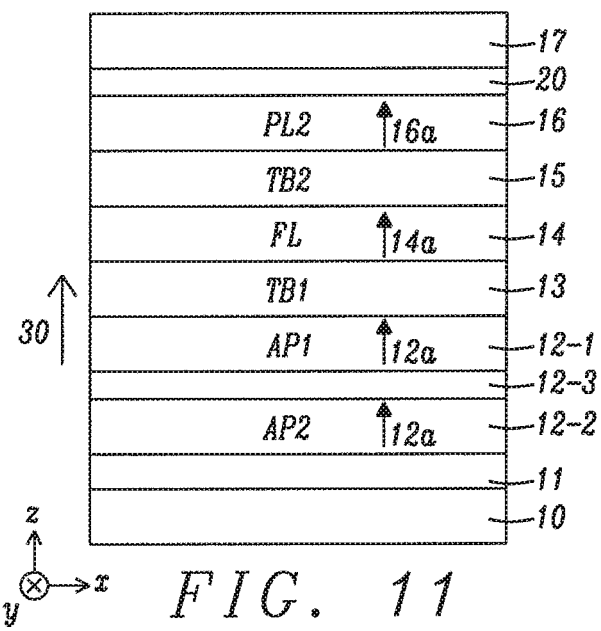
FIGS. 11-12 are cross-sectional views depicting an initialization sequence comprised of two applied fields to provide the DMTJ configuration in FIG. 1B.

The present disclosure also encompasses an initialization sequence for forming the magnetic layer orientations shown in FIG. 1B or in the alternative embodiments where there is an AP/P state for DMTJ 1b (or DMTJ 1c, 1d or 1e) in which PL1 AP1 magnetization 12m is antiparallel to PL2 magnetization 16a (or 16a1/16a2). Referring to FIG. 11, a first step in the initialization sequence is application of a magnetic field 30 in a vertical (z-axis) direction such that the applied field has sufficient magnitude to set pinned layer magnetizations 12a, 16a, as well as FL magnetization 14a in the same direction as the applied field. In the exemplary embodiment, the applied field 30 is in a (+) z-axis direction. However, in an alternative embodiment (not shown), the applied field may be in a (−) z-axis direction to provide magnetizations 12m, 16m, and 14m opposite to 12a, 16a, 14a, respectively.

Figure 12:
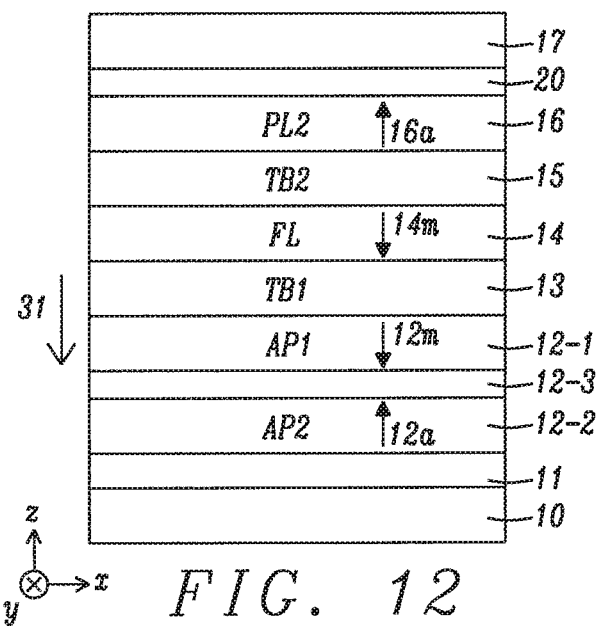

According to a second step in the initialization sequence shown in FIG. 12, a second applied field 31 is provided in a direction opposite to the direction of the first applied field, and has a magnitude sufficient to switch only FL magnetization 14a to 14m, and to flip PL1 AP1 magnetization 12a to 12m. As a result, PL1 AP1 magnetization is now antiparallel to PL2 magnetization 16a. AF coupling layer 12-3 induces PL1 AP2 magnetization 12a after field 31 is removed. Note that PL2 16 coercivity must be larger than that of PL1 AP1 12-1 coercivity in order to maintain PL2 magnetization 16a during the second applied field.

Figures 13, 14:
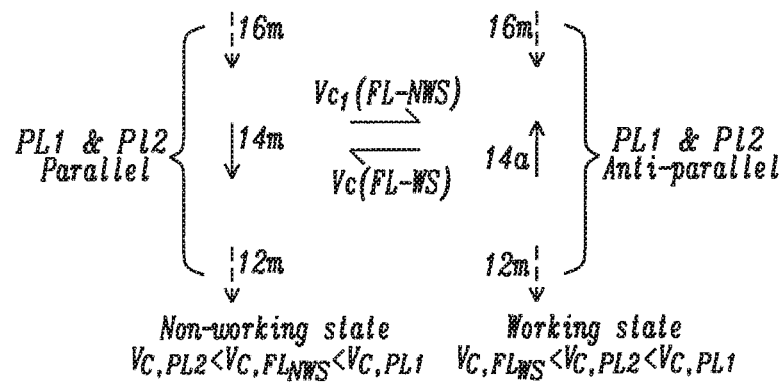
FIG. 13 depicts an initialization method based on applying a voltage to establish the antiparallel alignment for PL1 AP1 and PL2 in FIG. 1B according to an embodiment of the present disclosure.
FIG. 14 is a table listing the free energy of oxide formation for various elements.

Referring to FIG. 13, an outline of a voltage initialization method is shown. A large magnetic field is first applied as with the previous method, and is sufficient to set the magnetizations of PL1, FL and PL2 all parallel to each other. As described previously in the disclosure, in this configuration (described in FIG. 1A.), the spin torque on the FL from PL1 and PL2 cancel, and a relatively higher write current is needed to switch the FL. This aspect of the non-working state (NWS) is utilized for the initialization of the stack to the working state (WS). Either PL1 or PL2 is designed in such a way that the switching voltage to flip the magnetization is lower than the voltage needed to rotate the FL magnetization in the non-working state, i.e. $V_{c,(FL-NWS)} >$ $V_{c(PL1 \text{ or } PL2)} > V_{c,(FL-WS)}$. Once PL1 (or PL2) magnetization rotates, the device goes to the working state (described in FIG. 1B).

All of the embodiments described herein may be incorporated in a manufacturing scheme with standard tools and processes. Net DRR, $RA_1$, $RA_2$, and $i_C$ for a DMTJ are simultaneously optimized by formation of a TB1 in a first p-MTJ substructure that has a $RA_1$ substantially less than $RA_2$ of an overlying TB2 in a second p-MTJ substructure. Furthermore, PL1 magnetization in the first p-MTJ is aligned antiparallel to the PL2 magnetization in the second p-MTJ after an initialization sequence is performed in order to ensure a lower $i_C$ compared with a p-MTJ in a single spin filter, or in a DMTJ having PL1 and PL2 AP1 magnetizations aligned parallel to each other. PL2 magnetization is stabilized by forming an interface with an overlying oxide capping layer, and by selecting a PL2 composition that provides lattice matching with TB2 after annealing. However, the oxide capping layer may be replaced with a laminated magnetic layer with fcc (111) texture and inherent PMA.

While the present disclosure has been particularly shown and described with reference to, the preferred embodiment thereof, it will be understood by those skilled in the art that various changes in form and details may be made without departing from the spirit and scope of this disclosure.

What is claimed is:

1. A method comprising:
   forming a first pinned ferromagnetic layer on a substrate;
   forming a first tunnel barrier layer on the first pinned ferromagnetic layer, the first tunnel barrier layer having a first resistance x area product ($RA_1$);
   forming a free layer that contacts a top surface of the first tunnel barrier layer;
   forming a second tunnel barrier layer that adjoins a top surface of the free layer, the second tunnel barrier layer having a second resistance x area product ($RA_2$) that is greater than $RA_1$;
   forming a second pinned ferromagnetic layer on the second tunnel barrier layer;
   forming a metal oxide or metal oxynitride capping layer that contacts a top surface of the second pinned ferromagnetic layer, and having a resistance x area product ($RA_{CAP}$) that is less than $RA_2$, wherein the metal oxide or metal oxynitride capping layer comprises a plurality of conductive channels in a metal oxide or metal oxynitride matrix in which the conductive channels extend from a top surface of the free layer to a bottom surface of an overlying hard mask; and
   performing an initialization process wherein a magnetization of the first pinned ferromagnetic layer is aligned antiparallel to a magnetization of the second pinned ferromagnetic layer, and a magnetization of the free layer, the magnetization of the first pinned ferromagnetic layer and the magnetization of the second pinned ferromagnetic layer are aligned orthogonal to the substrate.

2. The method of claim 1, wherein the metal oxide or metal oxynitride capping layer is formed by sputter depositing a metal oxide target or a metal oxynitride target, respectively, with a radio frequency (RF) physical vapor deposition (PVD) process, and wherein the metal therein is one or more of Mg, Al, Ti, Ta, Fe, Co, B, and Ru.

3. The method of claim 1, wherein one or both of the first tunnel barrier layer and the metal oxide or metal oxynitride capping layer has one or both of a smaller thickness and a lower oxidation state than the second tunnel barrier layer.

4. The method of claim 1, wherein the conductive channels are comprised of a metal or alloy selected from one or more of Pt, Au, Ag, Mg, Al, Ca, Sr, Ba, Sc, Y, La, Co, Fe, B, Mn, Mo, Ru, Rh, Ir, Ni, Pd, Zn, Cu, Ti, V, Cr, Zr, Nb, Mo, Hf, Ta, Os, and W.

5. The method of claim 1, wherein the first tunnel barrier layer, the second tunnel barrier layer and the metal oxide or metal oxynitride capping layer are formed with a RF PVD process.

6. The method of claim 1, wherein the plurality of conductive channels in the metal oxide or metal oxynitride matrix is formed by a process that includes:
   forming a metal oxide layer or a metal oxynitride layer on the second pinned ferromagnetic layer;
   exposing the metal oxide layer or metal oxynitride layer to a reactive environment comprised of a second metal species; and
   performing one or more anneal steps such that conductive channels are generated in the metal oxide or metal oxynitride matrix, the conductive channels including the second metal species.

7. The method of claim 1, further comprising performing one or more anneal steps after forming the first tunnel barrier layer on the first pinned ferromagnetic layer.

8. The method of claim 1, wherein the substrate is a metal oxide Hk enhancing layer.

9. The method of claim 1, wherein the plurality of conductive channels in the metal oxide matrix or metal oxynitride matrix is formed by a process comprised of co-depositing a metal species, an oxygen (O) or oxygen and nitrogen species, and a second metal species.

10. The method of claim 9, further comprising performing one or more anneal steps after the co-deposition is completed to enable a conglomeration of the second metal species into conductive channels.

11. The method of claim 1, wherein the second pinned ferromagnetic layer includes one or more of Co, Fe, Ni or an alloy thereof with B,
   wherein the forming of the second pinned ferromagnetic layer on the second tunnel barrier layer includes depositing an amorphous second pinned ferromagnetic layer on the second tunnel barrier layer, and
   wherein the method further comprises performing an anneal process to convert the amorphous second pinned ferromagnetic layer into the second pinned ferromagnetic layer having a body center cubic structure.

12. The method of claim 11, wherein the forming of the metal oxide or metal oxynitride capping layer includes oxidation or oxynitridation of a portion of the second pinned ferromagnetic layer.

13. A method comprising:
   forming a first tunnel barrier layer over a substrate, the first tunnel barrier layer having a first resistance x area product ($RA_1$);
   forming a free layer on the first tunnel barrier layer;
   forming a second tunnel barrier layer on the free layer, the second tunnel barrier layer having a second resistance x area product ($RA_2$) that is different than $RA_1$;
   forming a first pinned layer on the second tunnel barrier layer; and
   forming a capping layer on the first pinned layer, the capping layer having a resistance x area product ($RA_{CAP}$) that is different than $RA_2$, wherein the forming of the capping layer on the first pinned layer includes performing an oxidation or oxynitridation process on a portion of the first pinned layer to thereby form a metal oxide capping layer or a metal oxynitride capping layer.

14. The method of claim 13, further comprising:

forming a second pinned layer, wherein the second pinned layer interfaces with the first tunnel barrier layer;

applying a first magnetic field in a first direction to set a magnetization of the first pinned ferromagnetic layer, a magnetization of the second pinned ferromagnetic layer and a magnetization of the free layer in the first direction; and applying a second magnetic field in a second direction such that the magnetization of the first pinned layer is aligned antiparallel to the magnetization of the second pinned ferromagnetic layer after the applying of the second magnetic field, the second direction being different than the first direction.

15. The method of claim 13, further comprising forming a plurality of conductive channels within the metal oxide capping layer or the metal oxynitride capping layer.

16. The method of claim 13, wherein the metal oxide capping layer or the metal oxynitride capping layer includes a dopant selected from the group consisting of N, S, Se, P, C, Te, As, Sb, Bi, Si, Pt, Au, Ir, W, or Mo.

17. The method of claim 16, further comprising exposing the metal oxide capping layer or the metal oxynitride capping layer to a reactive environment comprised of the dopant.

18. The method of claim 16, further comprising implanting the dopant into the metal oxide capping layer or the metal oxynitride capping layer.

19. A method comprising:

forming a first pinned layer disposed over a substrate;

forming a first tunnel barrier layer on the first pinned ferromagnetic layer;

forming a free layer on the first tunnel barrier layer;

forming a second tunnel barrier layer on the free layer;

forming a second pinned layer on the second tunnel barrier layer; and forming an oxide capping layer on the second pinned ferromagnetic layer, wherein the forming of the oxide capping layer includes forming a first plurality of conductive channels within the oxide capping layer.

20. The method of claim 19, wherein the first tunnel barrier layer has a first resistance x area product ($RA_1$) and the second tunnel barrier layer has a second resistance x area product ($RA_2$) that is different than $RA_1$.

* * * * *